(12) United States Patent
Kim

(10) Patent No.: US 11,222,934 B2
(45) Date of Patent: Jan. 11, 2022

(54) FLEXIBLE DISPLAY DEVICE WITH REINFORCING MEMBERS

(71) Applicant: Samsung Display Co., Ltd., Yongin-si (KR)

(72) Inventor: Younjoon Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/121,637

(22) Filed: Sep. 5, 2018

(65) Prior Publication Data

US 2019/0198586 A1   Jun. 27, 2019

(51) Int. Cl.
| | | |
|---|---|---|
| *H01L 27/32* | (2006.01) | |
| *G09F 9/30* | (2006.01) | |
| *H01L 33/44* | (2010.01) | |
| *H01L 51/52* | (2006.01) | |
| *G09G 3/3208* | (2016.01) | |

(52) U.S. Cl.
CPC .......... *H01L 27/3246* (2013.01); *G09F 9/301* (2013.01); *G09G 3/3208* (2013.01); *H01L 33/44* (2013.01); *H01L 51/5237* (2013.01); *G09G 2300/0426* (2013.01); *G09G 2310/0264* (2013.01); *H01L 2251/5338* (2013.01)

(58) Field of Classification Search
CPC .................... H01L 51/0097; H01L 2251/5338
See application file for complete search history.

(56) References Cited

U.S. PATENT DOCUMENTS

| | | | |
|---|---|---|---|
| 2014/0176849 A1 | 6/2014 | Lee et al. | |
| 2014/0217382 A1* | 8/2014 | Kwon | H01L 51/0097 257/40 |
| 2014/0307396 A1* | 10/2014 | Lee | H05K 1/028 361/749 |
| 2015/0064819 A1 | 3/2015 | Lee | |
| 2016/0072094 A1 | 3/2016 | Kim | |
| 2016/0155788 A1* | 6/2016 | Kwon | H01L 51/0097 257/40 |
| 2016/0270269 A1* | 9/2016 | Bae | G06F 1/20 |
| 2017/0249887 A1 | 8/2017 | Ahn | |

FOREIGN PATENT DOCUMENTS

| | | |
|---|---|---|
| KR | 20140082267 | 7/2014 |
| KR | 20150027603 | 3/2015 |
| KR | 20160030599 | 3/2016 |
| KR | 20170022622 | 3/2017 |
| KR | 20170003787 | 11/2017 |

\* cited by examiner

*Primary Examiner* — Daniel Whalen

(74) *Attorney, Agent, or Firm* — H.C. Park & Associates, PLC

(57) ABSTRACT

A display device is improved in terms of bending characteristics, the display device including: a window, a display panel, and a reinforcing member. A protective film is not disposed between the display panel and the reinforcing member, and a protective film is not disposed on a lower surface of the reinforcing member.

21 Claims, 4 Drawing Sheets

FLEXIBLE DISPLAY DEVICE WITH REINFORCING MEMBERS

CROSS-REFERENCE TO RELATED APPLICATION

This application claims priority from and the benefit of Korean Patent Application No. 10-2017-0177644, filed on Dec. 22, 2017, which is hereby incorporated by reference for all purposes as if fully set forth herein.

BACKGROUND

Field

Exemplary embodiments of the invention relate generally to a display device.

Discussion of the Background

Flexible display devices that are bendable are being developed. Such flexible display devices may be used in various fields because they may be used in a folded or curved form. The flexible display devices have a structure in which a display element is disposed on a flexible substrate.

Examples of the display elements that may be applicable to the flexible display devices may include organic light emitting diode ("OLED") elements, liquid crystal display ("LCD") elements, electrophoretic display (EPD) elements, or the like. Among these, OLEDs are attracting attention as display elements of such flexible display devices because they may be manufactured into a stack structure of a thin film shape to have excellent flexibility.

In order to utilize the flexible display devices in various fields, display devices having excellent bending characteristics are required.

In addition, when a flexible display panel of the flexible display device includes a polyimide (PI) film as a lower protective film, a large amount of carbonized contaminants is accumulated on a cut surface during a $CO_2$ laser cutting process for a mother substrate on which the lower protective film is laminated.

The above information disclosed in this Background section is only for understanding of the background of the inventive concepts, and, therefore, it may contain information that does not constitute prior art.

SUMMARY

Devices constructed according to exemplary embodiments of the invention are capable of omitting protective film layers that affect flexibility of a display panel.

Exemplary embodiments of the present invention may be directed to a display device having improved bending characteristics.

Additional features of the inventive concepts will be set forth in the description which follows, and in part will be apparent from the description, or may be learned by practice of the inventive concepts.

According to an exemplary embodiment, a display device includes: a display panel including a planar area, a bending area extending from the planar area, and a surrounding area extending from the bending area; and a first reinforcing member attached to a lower surface of the display panel at the planar area, and a second reinforcing member attached to the lower surface of the display panel at the surrounding area. The first reinforcing member contacts the second reinforcing member.

The first reinforcing member may include one surface attached to the display panel and a second surface opposing the one surface, the second reinforcing member may include one surface attached to the display panel and a second surface opposing the one surface, and the second surface of the first reinforcing member may contact the second surface of the second reinforcing member.

A protective film may not be disposed between the second surface of the first reinforcing member and the second surface of the second reinforcing member.

The first reinforcing member and the second reinforcing member may include a thermoplastic resin.

The thermoplastic resin may be thermoplastic polyurethane (TPU).

The first reinforcing member may be coated with a black coating layer, such as black ink.

The second reinforcing member may have light transmittance.

The first reinforcing member and the second reinforcing member may further include an anti-static coating layer.

Each of the first reinforcing member and the second reinforcing member may have a thickness in a range from about 200 μm to about 300 μm.

The display device may further include a first adhesive layer disposed between the display panel and the first reinforcing member and between the display panel and the second reinforcing member.

The first adhesive layer may have a thickness in a range from about 20 μm to about 80 μm.

The first reinforcing member and the second reinforcing member may be disposed apart from each other.

The first reinforcing member and the second reinforcing member may be attached to a back surface of the display panel.

The display device may further include: a window on the display panel; and a second adhesive layer between the display panel and the window.

The second adhesive layer may have a thickness in a range from about 20 μm to about 80 μm.

The display panel may include: a substrate which is flexible; a gate line disposed on the substrate at the planar area; a data line crossing the gate line; and a thin film transistor connected to the gate line and the data line.

The display device may further include: a driving integrated circuit on the display panel at the surrounding area.

The substrate may further include a protection member on the bending area.

The display panel may further include a planarization layer.

According to an exemplary embodiment, a display device includes: a display panel including a planar area, a bending area extending from the planar area, and a surrounding area extending from the bending area; a first reinforcing member attached to a lower surface of the display panel at the planar area, and a second reinforcing member attached to the lower surface of the display panel at the surrounding area; and a housing accommodating the display panel, the first reinforcing member, and the second reinforcing member. The first reinforcing member includes one surface attached to the display panel and a second surface opposing the one surface, the second reinforcing member includes one surface attached to the display panel and a second surface opposing the one surface, and at least a portion of the second surface of the first reinforcing member contacts the housing.

The second surface of the first reinforcing member may contact the second surface of the second reinforcing member.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
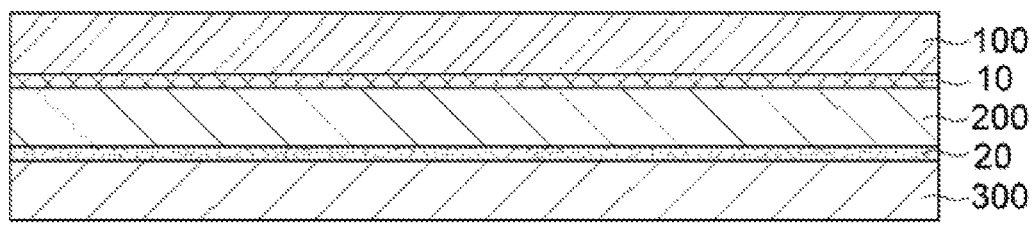
FIG. 1 is a schematic cross-sectional view illustrating a display device according to an exemplary embodiment of the present invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including,"

when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

In exemplary embodiments, the driving integrated chip, and/or one or more components thereof, may be implemented by known means or via one or more general purpose and/or special purpose components, such as one or more discrete circuits, digital signal processing chips, integrated circuits, application specific integrated circuits, microprocessors, processors, programmable arrays, field programmable arrays, instruction set processors, and/or the like.

According to one or more exemplary embodiments, the features, functions, processes, etc., described herein may be implemented via software, hardware (e.g., general processor, digital signal processing (DSP) chip, an application specific integrated circuit (ASIC), field programmable gate arrays (FPGAs), etc.), firmware, or a combination thereof. In this manner, driving integrated chip, and/or one or more components thereof may include or otherwise be associated with one or more memories (not shown) including code (e.g., instructions) configured to cause the driving integrated chip, and/or one or more components thereof to perform one or more of the features, functions, processes, etc., described herein.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts which are not associated with the description may not be provided in order to specifically describe embodiments of the present invention and like reference numerals refer to like elements throughout the specification.

FIG. 1 is a schematic cross-sectional view illustrating a display device according to an exemplary embodiment of the present invention.

Referring to FIG. 1, a display device according to an exemplary embodiment of the present invention includes a window 100, a display panel 200, and a reinforcing member 300.

The window 100 may protect the display panel 200 so that the display panel 200 is not broken by external shocks. The window 100 may be located above the display panel 200.

The window 100 may include or be formed of a transparent material such as glass or resin.

The display panel 200 may be an organic light emitting diode ("OLED") display panel or a liquid crystal display ("LCD") panel including a plastic material having flexibility. A more detailed configuration of the flexible display panel 200 will be described below.

The reinforcing member 300 is directly attached to a lower surface of the display panel 200. The reinforcing member 300 serves to buffer external shocks and prevent static charges. No separate protective film is disposed between the display panel 200 and the reinforcing member 300.

No separate protective film is disposed on a lower surface of the reinforcing member 300.

A first adhesive layer 20 is disposed between a back surface of the display panel 200 and the reinforcing member 300. That is, the back surface of the display panel 200 and one surface of the reinforcing member 300 are attached to each other by the first adhesive layer 20. The first adhesive layer 20 has a thickness in a range from about 20 μm to about 80 μm.

A second adhesive layer 10 is disposed between the display panel 200 and the window 100.

That is, an upper surface of the display panel 200 and a back surface of the window 100 are attached to each other by the second adhesive layer 10.

The second adhesive layer 10 has a thickness in a range from about 20 μm to about 80 μm.

Figure 2:
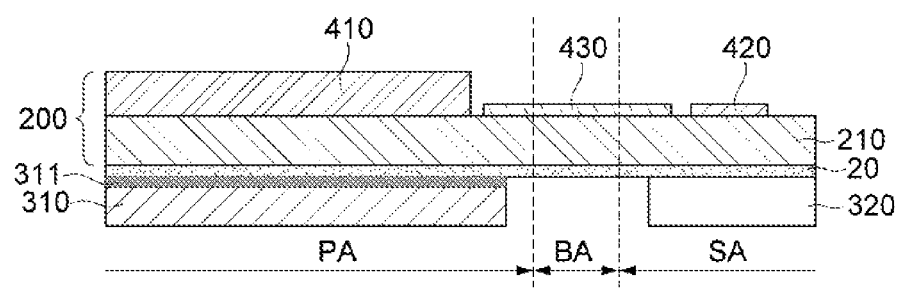
FIG. 2 is a cross-sectional view illustrating a display panel and a reinforcing member.
Figure 3:
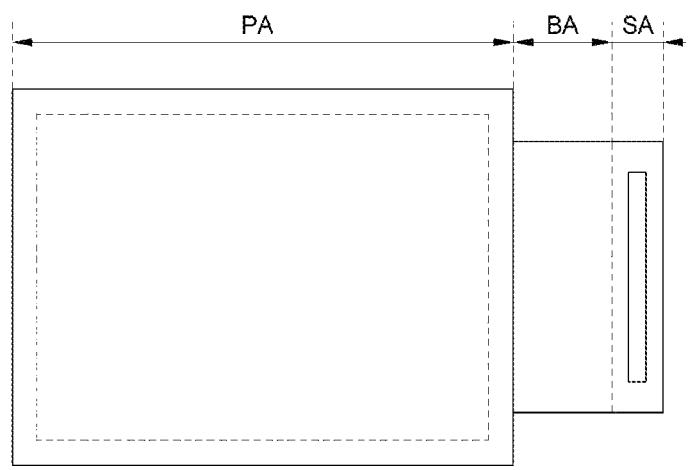
FIG. 3 is a plan view illustrating a display device according to an exemplary embodiment of the present invention.
Figure 4:
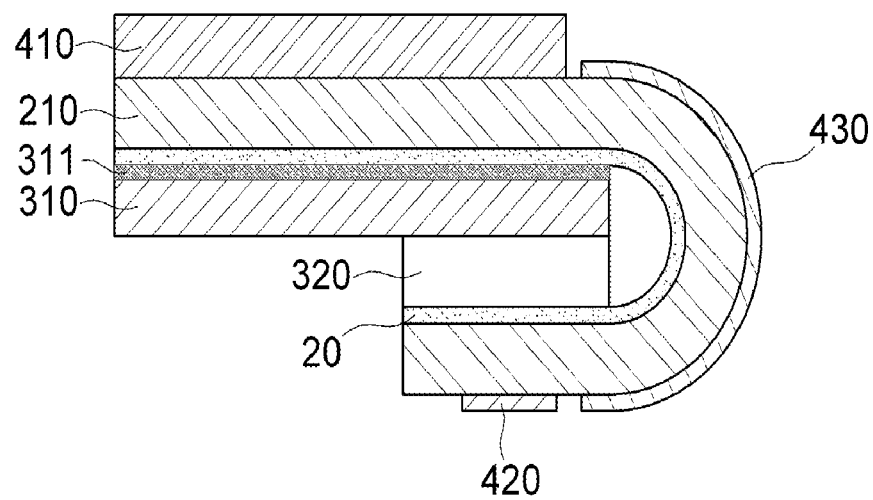
FIG. 4 is a cross-sectional view illustrating a display device according to an exemplary embodiment of the present invention in a folded state.

FIG. 2 is a cross-sectional view illustrating the display panel and the reinforcing member, FIG. 3 is a plan view illustrating a display device according to an exemplary embodiment of the present invention, and FIG. 4 is a cross-sectional view illustrating a display device according to an exemplary embodiment of the present invention in a folded state.

Referring to FIGS. 2 to 4, the display panel 200 includes a substrate 210, a driving circuit unit 410, a protection member 430, and a driving integrated chip ("IC") 420.

The substrate 210 includes a planar area PA including a display area, a bending area BA extending from the planar area PA, and a surrounding area SA extending from the bending area BA. The substrate 210 according to an exemplary embodiment of the present invention may be bent at the bending area BA such that the surrounding area SA on which the driving IC 420 is disposed may be located on a back surface of the planar area PA.

In addition, although the substrate 210 is shown to have a uniform thickness, exemplary embodiments are not limited thereto. The substrate 210 may have a smaller thickness at the bending area BA than at the planar area PA.

The substrate 210 may include a flexible plastic material. For example, the substrate 210 may include one of: kapton, polyethersulphone (PES), polycarbonate (PC), polyimide (PI), polyethyleneterephthalate (PET), polyethylene naphthalate (PEN), polyacrylate (PAR), fiber reinforced plastic (FRP), or the like.

The driving circuit unit 410, the protection member 430, and the driving IC 420 are disposed on the substrate 210 at the planar area PA.

The driving circuit unit 410 includes a gate line, a data line crossing the gate line, a thin film transistor connected to the gate line and the data line, and an OLED (not shown). That is, the OLED emits light according to a driving signal received through the gate line, the data line, and the thin film transistor to display images, which will be described in detail below.

An encapsulating layer (not shown) is disposed on the driving circuit unit 410. The encapsulating layer (not shown) substantially prevents an outside air such as moisture or oxygen from penetrating into the driving circuit unit 410.

The driving IC 420 is a component mounted with a circuit chip or the like, and receives a driving signal from an external or separate printed circuit board ("PCB") (not shown). The driving IC 420 may convert the driving signal input thereto, and may apply the converted driving signal to the display area DA of the planar area PA through a signal line (not shown). It is described herein that the driving IC 420 according to an exemplary embodiment of the present invention is mounted on the substrate 210 in a chip on glass (COG) manner, but exemplary embodiments are not limited thereto. Alternatively, the driving IC may be mounted on a separate PCB, FPCB, or the like.

The protection member 430 is disposed at the bending area BA of the substrate 210 to substantially prevent breakage and moisture permeation of a metal wiring (not shown) disposed between the driving circuit unit 410 and the driving IC 420. The protection member 430 may include or be formed of a photocurable resin.

The reinforcing member 300 is directly attached to a lower surface of the substrate 210. The reinforcing member 300 serves to buffer external shocks and prevent static charges. No separate protective film is disposed between the substrate 210 and the reinforcing member 300.

The first adhesive layer 20 is disposed between the back surface of the display panel 200 and the reinforcing member 300. That is, the back surface of the display panel 200 and one surface of the reinforcing member 300 are attached to each other by the first adhesive layer 20. The first adhesive layer 20 has a thickness in a range from about 20 μm to about 80 μm.

The reinforcing member 300 includes a first reinforcing member 310 disposed on the lower surface of the substrate 210 at the planar area PA and a second reinforcing member 320 disposed on the lower surface of the substrate 210 at the surrounding area SA.

The first reinforcing member 310 serves to buffer external shocks, prevent static charges, and block light. The first reinforcing member 310 may include or be formed of thermoplastic polyurethane (TPU). The first reinforcing member 310 has a thickness in a range from about 200 μm to about 300 μm.

The first reinforcing member 310 includes a black coating layer 311 which blocks light so that a pad area of the display panel 200 is not visible from the outside. The black coating layer 311 includes or be formed of at least one known black pigment of carbon black, iron oxide, copper oxide, tin oxide, azo dyes, nigrosine, perylene, anilene black, or the like, and may take the form of black ink.

The first reinforcing member 310 further includes an anti-static coating layer.

The second reinforcing member 320 serves to buffer external shocks, prevent static charges, and block light. The second reinforcing member 320 may include or be formed of thermoplastic polyurethane (TPU). The second reinforcing member 320 has a thickness in a range from about 200 μm to about 300 μm.

The second reinforcing member 320 further includes an anti-static coating layer.

Since the second reinforcing member 320 does not include a black coating layer 311 and has light transmitting characteristics, the second reinforcing member 320 allows an alignment mark of the driving IC 420 or the like to be visually recognized.

The first reinforcing member 310 and the second reinforcing member 320 are disposed apart from each other.

The first reinforcing member 310 contacts the second reinforcing member 320.

More specifically, the first reinforcing member 310 includes one surface attached to the display panel 200 and second surface opposing the one surface, and the second reinforcing member 320 includes one surface attached to the display panel 200 and second surface opposing the one surface.

The second surface of the first reinforcing member 310 contacts the second surface of the second reinforcing member 320.

The display panel 200 is bent at the bending area BA such that the second surface of the first reinforcing member 310 disposed on the lower surface of the display panel 200 and the second surface of the second reinforcing member 320 contact each other.

No separate protective film is included between the second surface of the first reinforcing member 310 and the second surface of the second reinforcing member 320.

Figure 5:
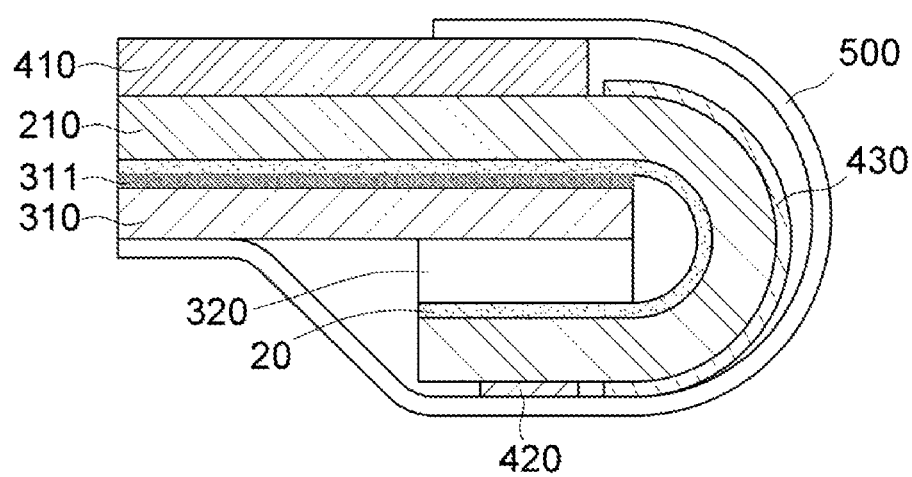
FIG. 5 is a cross-sectional view illustrating a display device according to second exemplary embodiment of the present invention in a folded state.

FIG. 5 is a cross-sectional view illustrating a display device according to another exemplary embodiment of the present invention in a folded state.

Referring to FIG. 5, a display device includes a display panel, a first reinforcing member 310, black coating layer 311, a second reinforcing member 320, and a housing 500. The display panel includes a substrate 210, a driving circuit unit 410, a protection member 430, and a driving IC 420. Since the display panel including the substrate 210, the driving circuit unit 410, the protection member 430, and the driving IC 420 are substantially the same as those described with reference to FIGS. 1 to 4, the descriptions thereof will be omitted.

The housing 500 has an accommodation space for accommodating the display panel 200, the first reinforcing member, and the second reinforcing member, and supports the display panel 200.

In addition, the housing 500 includes a mechanism for folding opposite surfaces of the display panel 200.

Since the first reinforcing member 310 does not include a protective film therebelow, at least a portion of second surface of the first reinforcing member 310 contacts the housing 500.

Figure 6:
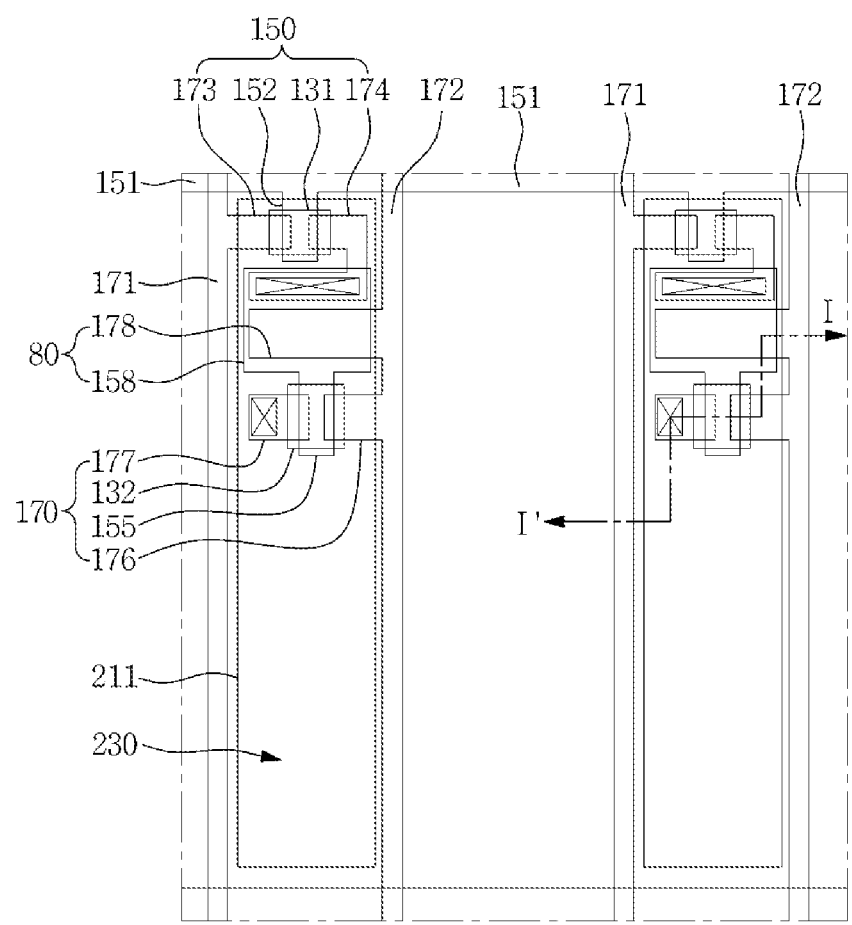
FIG. 6 is a view enlarging a part of a display panel according to an exemplary embodiment of the present invention.
Figure 7:
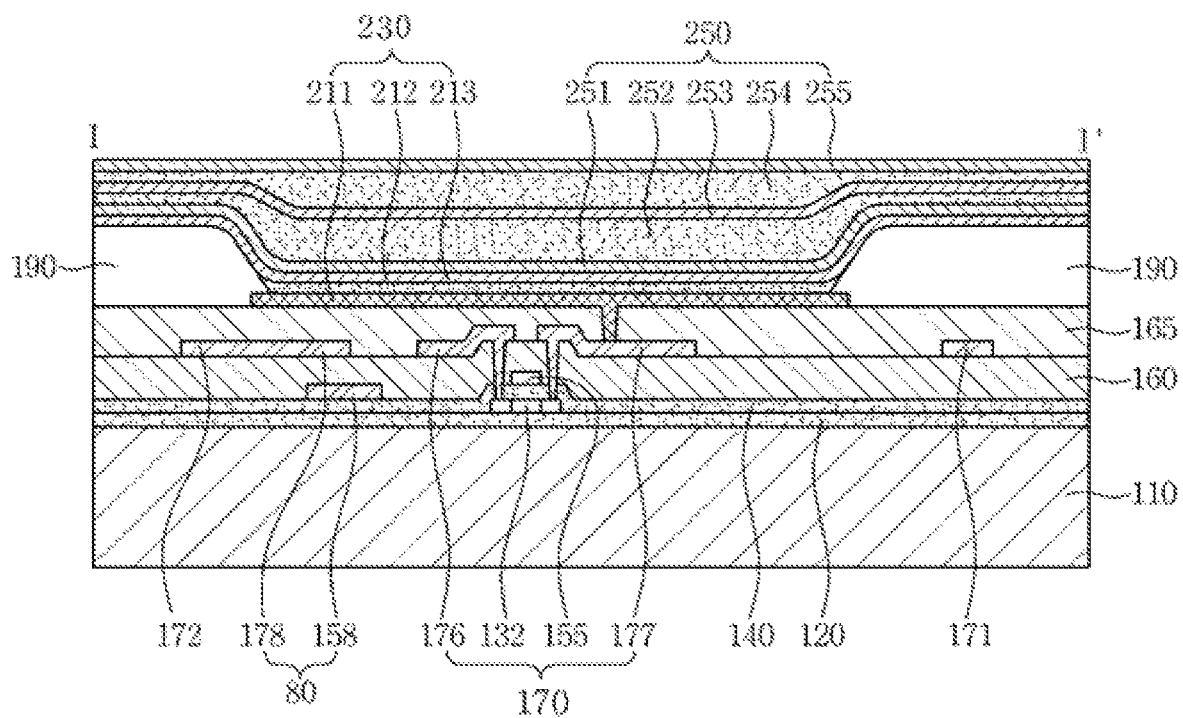
FIG. 7 is a cross-sectional view taken along line I-I' of FIG. 6.

FIG. 6 is a view enlarging a part of a display panel according to an exemplary embodiment of the present invention, and FIG. 7 is a cross-sectional view taken along line I-I' of FIG. 6.

Referring to FIGS. 6 and 7, a display panel according to an exemplary embodiment of the present invention includes a plurality of pixels, each including a switching thin film transistor 150, a driving thin film transistor 170, a capacitor 80, and an OLED 230. The OLED 230 may be largely applied to flexible display devices as it can be deposited at a relatively low temperature and has low power consumption, high luminance, and the like. Herein, the pixel refers to a minimum unit for displaying images, and the display panel displays images through the plurality of pixels.

Although it is illustrated in the accompanying drawings that one pixel includes two thin film transistors and one capacitor, exemplary embodiments are not limited thereto. Alternatively, one pixel may include three or more thin film transistors and two or more capacitors, and may have various structures including additional wirings.

The display panel 200 may include a substrate 210, a gate line 151 on the substrate 210, and a data line 171 and a common power line 172 insulated from and crossing the gate line 151. One pixel PX may be typically defined by the gate line 151, the data line 171 and the common power line 172, in which they become a boundary, but exemplary embodiments are not limited thereto. The pixel may be defined by a pixel defining layer or a black matrix.

A gate insulating layer 140 is disposed on the switching semiconductor layer 131 and the driving semiconductor layer 132. The gate insulating layer 140 may include at least one of: tetraethylorthosilicate (TEOS), silicon nitride ($SiN_x$), and silicon oxide ($SiO_2$).

A gate wiring which includes gate electrodes 152 and 155 is disposed on the gate insulating layer 140. The gate wiring further includes the gate line 151, a first capacitor plate 158, and other signal lines. In addition, the gate electrodes 152 and 155 are disposed so as to overlap at least a portion of the semiconductor layers 131 and 132, for example, a channel area thereof.

The gate electrodes 152 and 155 and the first capacitor plate 158 are disposed on a substantially same layer and include a substantially same metal material. The gate electrodes 152 and 155 and the first capacitor plate 158 may include at least one of molybdenum (Mo), chromium (Cr), and tungsten (W).

An insulating interlayer 160 is disposed on the gate insulating layer 140 so as to cover the gate electrodes 152 and 155. The insulating interlayer 160, similar to the gate insulating layer 140, may include or be formed of silicon nitride (SiNx), silicon oxide (SiOx), tetraethoxysilane (TEOS), or the like, but exemplary embodiments are not limited thereto.

A data wiring which includes source electrodes 173 and 176 and drain electrodes 174 and 177 is disposed on the insulating interlayer 160. The data wiring further includes the data line 171, the common power line 172, a second capacitor plate 178, and other wirings. In addition, the source electrodes 173 and 176 and the drain electrodes 174 and 177 are connected to a source area and a drain area of the semiconductor layers 131 and 132, respectively, through a contact hole defined at the gate insulating layer 140 and the insulating interlayer 160.

As such, the switching thin film transistor 150 includes the switching semiconductor layer 131, the switching gate electrode 152, the switching source electrode 173, and the switching drain electrode 174, and the driving thin film transistor 170 includes the driving semiconductor layer 132, the driving gate electrode 155, the driving source electrode 176, and the driving drain electrode 177. However, configurations of the thin film transistors 150 and 170 are not limited thereto, and thus may be modified into various structures that are easily conceived by those skilled in the pertinent art.

In addition, the capacitor 80 includes the first capacitor plate 158 and the second capacitor plate 178 with the insulating interlayer 160 interposed therebetween.

The switching thin film transistor 150 may function as a switching element to select pixels to perform light emission. The switching gate electrode 152 is connected to the gate line 151. The switching source electrode 173 is connected to the data line 171. The switching drain electrode 174 is spaced apart from the switching source electrode 173 and is connected to the first capacitor plate 158.

The driving thin film transistor 170 applies, to a pixel electrode 211, a driving power which allows a light emitting layer 212 of an OLED 230 in a selected pixel to emit light. The driving gate electrode 155 is connected to the first capacitor plate 158. Each of the driving source electrode 176 and the second capacitor plate 178 is connected to the common power line 172. The driving drain electrode 177 is connected to the pixel electrode 211 of the OLED 230 through a contact hole.

With the aforementioned structure, the switching thin film transistor 150 is driven by a gate voltage applied to the gate line 151 and serves to transmit a data voltage, applied to the data line 171, to the driving thin film transistor 170. A voltage equivalent to a difference between a common voltage applied to the driving thin film transistor 170 from the common power line 172 and the data voltage transmitted from the switching thin film transistor 150 is stored in the capacitor 80, and a current corresponding to the voltage stored in the capacitor 80 flows to the OLED 230 through the driving thin film transistor 170, and thus the OLED 230 may emit light.

A planarization layer 165 is disposed to cover the data wiring, e.g., the data line 171, the common power line 172, the source electrodes 173 and 176, the drain electrodes 174 and 177, and the second capacitor plate 178, which are patterned into a substantially same layer on the insulating interlayer 160.

The planarization layer 165 serves to substantially eliminate a step difference and planarize a surface therebelow so as to increase luminous efficiency of the OLED 230 to be formed thereon.

The pixel electrode 211 of the OLED 230 is disposed on the planarization layer 165. The pixel electrode 211 is connected to the drain electrode 177 through a contact hole defined at the planarization layer 165.

A pixel defining layer 190 which exposes at least a portion of the pixel electrode 211 to define a pixel area is disposed on the planarization layer 165. The pixel electrode 211 is disposed corresponding to the pixel area which is defined by the pixel defining layer 190.

The light emitting layer 212 is disposed on the pixel electrode 211 in the pixel area, and a common electrode 213 is disposed on the pixel defining layer 190 and the light emitting layer 212. The light emitting layer 212 includes a low molecular organic material or a high molecular organic material. At least one of a hole injection layer HIL and a hole transport layer HTL may further be disposed between the pixel electrode 211 and the light emitting layer 212, and at least one of an electron transport layer ETL and an electron injection layer EIL may further be disposed between the light emitting layer 212 and the common electrode 213.

The pixel electrode 211 and the common electrode 213 may be formed as one of a transmissive electrode, a transflective electrode and a reflective electrode.

Transparent conductive oxide ("TCO") may be used to form a transmissive electrode. Examples of the TCO may include: indium tin oxide (ITO), indium zinc oxide (IZO), zinc oxide (ZnO), indium oxide ($In_2O_3$), of the like.

A metal, e.g., magnesium (Mg), silver (Ag), gold (Au), calcium (Ca), lithium (Li), chromium (Cr), aluminum (Al), and copper (Cu), or an alloy thereof may be used to form a transflective electrode and a reflective electrode. In such an exemplary embodiment, whether an electrode is a transflective type or a reflective type depends on the thickness of the electrode. Typically, the transflective electrode has a thickness of about 200 nm or less, and the reflective electrode has a thickness of about 300 nm or more. As the thickness of the transflective electrode decreases, light transmittance and resistance increase. On the contrary, as the thickness of the transflective electrode increases, light transmittance decreases.

In addition, the transflective electrode and the reflective electrode may have a multilayer structure which includes a metal layer including a metal or a metal alloy and a TCO layer stacked on the metal layer.

An encapsulation layer 250 is disposed on the common electrode 213. The encapsulation layer 250 includes one or more inorganic layers and one or more organic layers. In addition, the encapsulation layer 250 has a structure in which the inorganic layers and the organic layers are laminated alternately with each other. In such an exemplary embodiment, an inorganic layer is disposed at a lowermost portion. That is, the inorganic layer is disposed most adjacent to the OLED 230.

The inorganic layer which has a high density of thin film may substantially prevent or efficiently reduce permeation of, mostly, moisture or oxygen. Permeation of moisture and oxygen into the OLED 230 may be largely prevented by the inorganic layer.

The encapsulation layer 250 may have a thickness of about 10 μm or less. Accordingly, an overall thickness of the display panel may become significantly small. By applying such an encapsulation layer 250, the display panel may have optimized flexible characteristics.

According to an exemplary embodiment of the present invention, a protective film is not disposed between the display panel 200 and the reinforcing member 300.

In addition, no separate protective film is disposed on a lower surface of the reinforcing member 300.

Accordingly, an overall thickness of the flexible display device may be reduced, and the bending characteristics may be improved.

As set forth hereinabove, according to one or more exemplary embodiments, a display device is improved in terms of bending characteristics.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display panel comprising a planar area, a bending area extending from the planar area, and a surrounding area extending from the bending area;
a first reinforcing member attached to a lower surface of the display panel at the planar area;
a second reinforcing member attached to the lower surface of the display panel at the surrounding area; and
a black coating layer configured to block visible light,
wherein the black coating layer is disposed between the first reinforcing member and the planar area of the display panel, and
wherein the second reinforcing member has visible light transmitting characteristics.

2. The display device of claim 1, wherein the first reinforcing member comprises one surface attached to the display panel and a second surface opposing the one surface, and
wherein the second reinforcing member comprises one surface attached to the display panel and a second surface opposing the one surface.

3. The display device of claim 2, wherein a protective film is not disposed between the second surface of the first reinforcing member and the second surface of the second reinforcing member.

4. The display device of claim 1, wherein the first reinforcing member and the second reinforcing member comprise a thermoplastic resin.

5. The display device of claim 4, wherein the thermoplastic resin is thermoplastic polyurethane (TPU).

6. The display device of claim 1, wherein the first reinforcing member and the second reinforcing member further comprise an anti-static coating layer.

7. The display device of claim 1, wherein each of the first reinforcing member and the second reinforcing member has a thickness in a range from about 200 μm to about 300 μm.

8. The display device of claim 1, further comprising a first adhesive layer disposed between the display panel and the first reinforcing member and between the display panel and the second reinforcing member.

9. The display device of claim 8, wherein the first adhesive layer has a thickness in a range from about 20 μm to about 80 μm.

10. The display device of claim 1, wherein the first reinforcing member and the second reinforcing member are disposed apart from each other.

11. The display device of claim 1, wherein the first reinforcing member and the second reinforcing member are attached to a back surface of the display panel.

12. The display device of claim 1, further comprising:
a window on the display panel; and
a second adhesive layer between the display panel and the window.

13. The display device of claim 12, wherein the second adhesive layer has a thickness in a range from about 20 μm to about 80 μm.

14. The display device of claim 1, wherein the display panel comprises:
a substrate which is flexible;
a gate line disposed on the substrate at the planar area;
a data line crossing the gate line; and
a thin film transistor connected to the gate line and the data line.

15. The display device of claim 14, further comprising a driving integrated circuit on the display panel at the surrounding area.

16. The display device of claim 14, wherein the substrate further comprises a protection member on the bending area.

17. The display device of claim 14, wherein the display panel further comprises a planarization layer.

18. The display device of claim 1, wherein the second reinforcing member does not include the black coating layer.

19. A display device comprising:
- a display panel including a planar area, a bending area extending from the planar area, and a surrounding area extending from the bending area;
- a first reinforcing member attached to a lower surface of the display panel at the planar area, and a second reinforcing member attached to the lower surface of the display panel at the surrounding area;
- a black coating layer; and
- a housing accommodating the display panel, the first reinforcing member, the second reinforcing member, and the black coating layer,
- wherein the first reinforcing member comprises one surface attached to the display panel and a second surface opposing the one surface,
- wherein the second reinforcing member comprises one surface attached to the display panel and a second surface opposing the one surface,
- wherein the black coating layer is disposed between the first reinforcing member and the planar area of the display panel,
- wherein the second reinforcing member has visible light transmitting characteristics, and
- wherein the black coating layer blocks visible light.

20. The display device of claim 19, wherein the housing is not disposed between the first reinforcing member and the second reinforcing member.

21. The display device of claim 19, wherein the housing contacts a driving circuit unit of the display panel.

* * * * *